(12) United States Patent
Louchart

(10) Patent No.: US 7,511,963 B2
(45) Date of Patent: Mar. 31, 2009

(54) HOUSING, IN PARTICULAR HOUSING FOR ELECTRONIC COMPONENTS OR THE LIKE

(75) Inventor: Gautier Louchart, Gometz la Ville (FR)

(73) Assignee: Continental Automotive France, Toulouse (FR)

( * ) Notice: Subject to any disclaimer, the term of this patent is extended or adjusted under 35 U.S.C. 154(b) by 503 days.

(21) Appl. No.: 10/564,099

(22) PCT Filed: May 13, 2004

(86) PCT No.: PCT/EP2004/005135

§ 371 (c)(1),
(2), (4) Date: Jan. 9, 2006

(87) PCT Pub. No.: WO2005/009097

PCT Pub. Date: Jan. 27, 2005

(65) Prior Publication Data

US 2007/0103852 A1    May 10, 2007

(30) Foreign Application Priority Data

Jul. 23, 2003    (FR) .................................. 03 08963

(51) Int. Cl.
*H05K 5/00*    (2006.01)

(52) U.S. Cl. .................. 361/752; 361/800; 361/790
(58) Field of Classification Search .................. 361/800, 361/752, 796–797, 714, 724
See application file for complete search history.

(56) References Cited

U.S. PATENT DOCUMENTS

| | | | | |
|---|---|---|---|---|
| 4,083,465 A | * | 4/1978 | Pate et al. | 220/3.8 |
| 4,666,055 A | * | 5/1987 | Lewis | 220/3.2 |
| 4,929,137 A | * | 5/1990 | Bossenmaier | 411/501 |
| 5,111,362 A | | 5/1992 | Flamm et al. | |
| 6,816,381 B2 | * | 11/2004 | Takeuchi | 361/752 |
| 2001/0028555 A1 | | 10/2001 | Takeuchi | |

FOREIGN PATENT DOCUMENTS

| | | |
|---|---|---|
| CA | 2 025 698 | 3/1992 |
| FR | 2 682 005 | 4/1993 |

* cited by examiner

*Primary Examiner*—Hung S Bui
(74) *Attorney, Agent, or Firm*—Young & Thompson

(57) ABSTRACT

This metal housing (2) is particularly intended to contain electronic or similar components. It includes a side wall (8) furnished with a ledge (20) having a bore (16) to receive a fixing screw (6). The side wall (8) has, at the bore (16), a recessed zone (10) whose concavity is oriented toward the outside of the housing (2), the ledge (20) intended to receive the screw (6) overhanging the recessed zone (10).

9 Claims, 2 Drawing Sheets

HOUSING, IN PARTICULAR HOUSING FOR ELECTRONIC COMPONENTS OR THE LIKE

FIELD OF THE INVENTION

The present invention relates to a housing, in particular a housing intended to contain electric or similar components, for example mounted on a printed circuit board (PCB) or similar element.

DESCRIPTION OF THE RELATED ART

Particularly in the electronics field, it is a known practice to use a metal housing inside which electronic components are placed on a printed circuit board. This housing comprises a cover which may, where necessary, consist of the printed circuit board. The cover is screwed onto the housing so as to close the latter reversibly. Often, the screws used are screws generating their own tapping during the screwing, such as self-tapping or self-forming screws. When they are screwed in, chips are produced and the latter fall inside the housing, the screw being inserted from the outside of the latter. The chips thus produced sometimes fall on the printed circuit board. They may then create a short circuit between the pins of the electronic components that are on the printed circuit board, or between two tracks of this circuit. Thus a chip may render an electronic device unusable.

Since the components are now implanted on the printed circuit boards increasingly close to one another, the problems of short circuits created by chips are increasingly frequent and are therefore becoming less and less acceptable.

SUMMARY OF THE INVENTION

The object of the present invention is therefore to provide a housing which, through its design, prevents a chip from reaching the printed circuit board intended to be placed inside the latter. Preferably, the proposed housing does not cost substantially more than a housing of the prior art.

Accordingly, it proposes a metal housing, particularly a housing intended to contain electronic or similar components, comprising a side wall furnished with a ledge having a bore to receive a fixing screw.

According to the invention, the side wall has, at the bore, a recessed zone whose concavity is oriented toward the outside of the housing, the ledge intended to receive the screw overhanging the recessed zone.

With such a housing, when the screw is screwed into the ledge, the stem of the screw having traversed the ledge enters the recessed zone, outside the housing, bringing with it any chips formed during the screwing. These chips are therefore brought toward the outside of the housing and can therefore not contaminate the electronic or other components that are inside the latter.

For the external dimensions of the housing according to the invention to remain unchanged relative to a similar housing of the prior art (that is to say a housing enclosing the same components), if the side wall is substantially flat, then provision is made for the overhanging ledge not to cross the plane of the wall.

When the side wall is substantially flat, then the overhanging ledge is preferably substantially perpendicular to the plane of the wall. The screw received in the ledge then extends substantially parallel to the wall.

To make it easier to discharge the chips outside the housing and keep them away from the latter, when the side wall is substantially flat, provision is advantageously made for the recessed zone to have a surface inclined relative to the plane of the side wall so as to discharge toward the outside of the housing any chips produced by the screwing of the fixing screw. In this embodiment, the inclined surface is advantageously connected to the overhanging ledge by a portion of wall substantially parallel to the side wall. This portion of wall parallel to the side wall is, when the fixing screw is in place, at the height of the stem of the fixing screw and is parallel to this screw stem, to the extent that the ledge is perpendicular to the side wall. This arrangement makes it possible to limit the space occupied inside the housing by the recessed zone and prevent the screw from coming to damage the wall of the recessed zone in which its stem comes to lodge.

In an embodiment of a housing according to the invention, the latter comprises a metal cap forming a cover, the electronic or similar components are supported by a printed circuit board and the peripheral edge of the printed circuit board is sandwiched between the cap and. the ledge intended to receive the fixing screw, the latter traversing the printed circuit board.

BRIEF DESCIPTION OF THE SEVERAL VIEWS OF THE DRAWINGS

Details and advantages of the present invention will better emerge from the following description, made with reference to the appended schematic drawing in which.

DETAILED DESCRIPTION OF THE PREFERRED EMBODIMENTS

Figure 1:
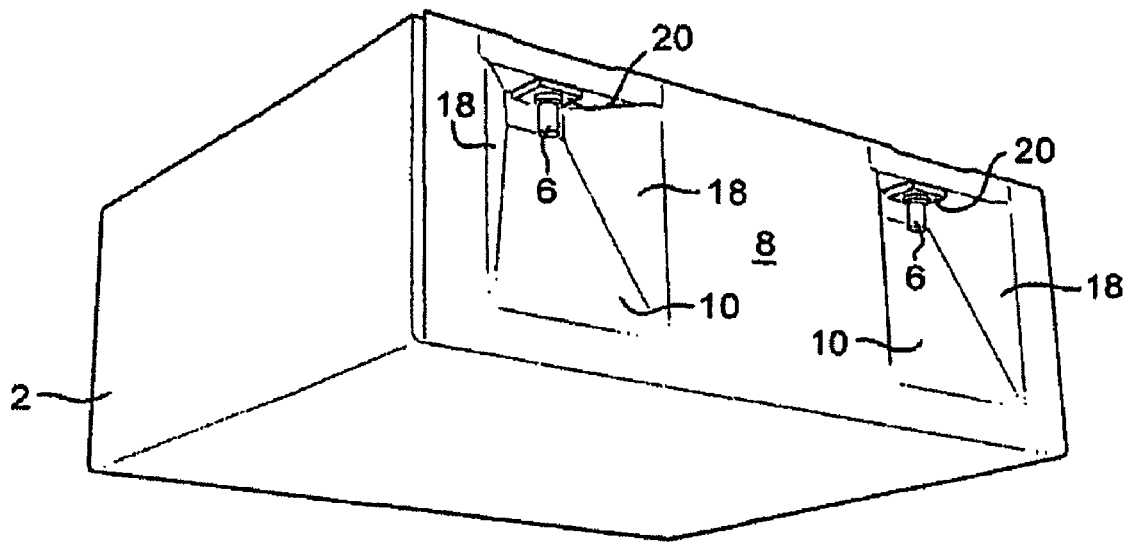
FIG. 1 is a view in perspective of a housing according to the invention.

In the drawing can be recognized a housing 2 enclosed by a cap 4. This housing 2 and the corresponding cap 4 are made for example of metal sheet. Screws 6 are used to hold the cap 4 on the housing 2. Preferably use is made here of self-forming screws which allow an excellent fix without using nuts. Such screws are designed to generate their own tapping when they are first screwed into an appropriate bore 16.

Figure 2:
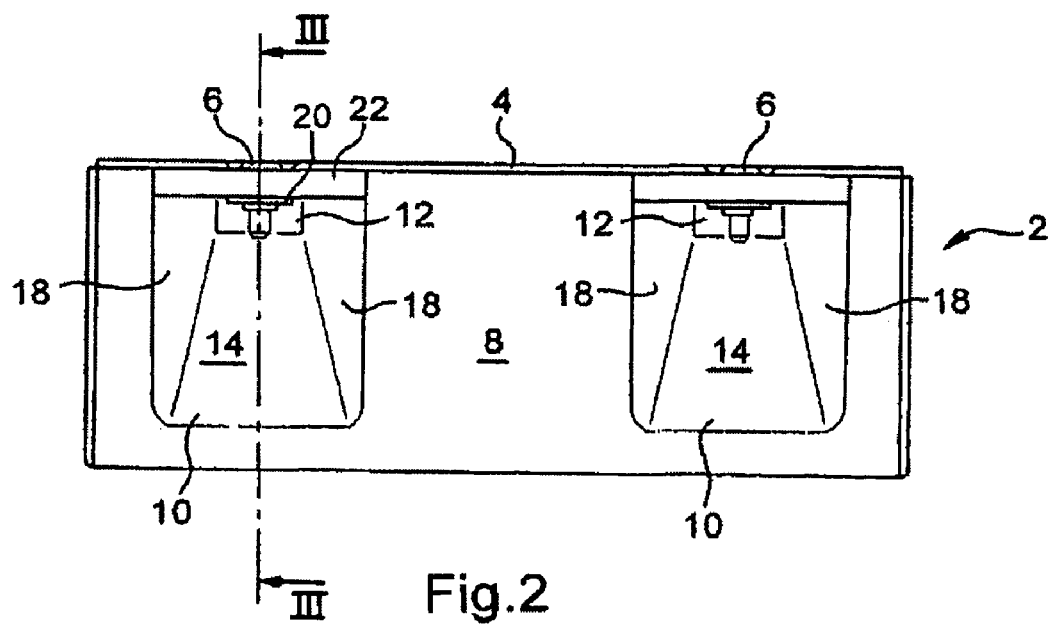
FIG. 2 is a front view of the housing of FIG. 1.
Figure 3:
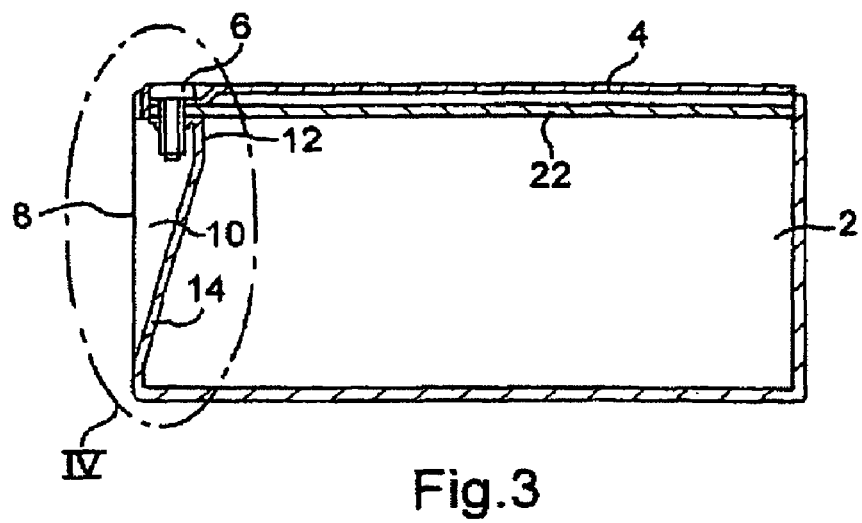
FIG. 3 is a view in section along the section line III-III of FIG. 2.
Figure 4:
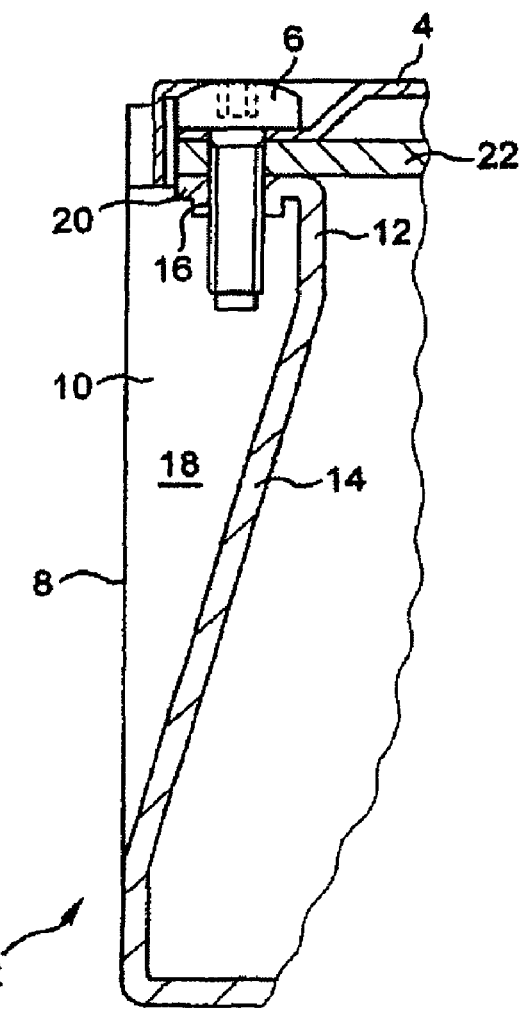
FIG. 4 shows the detail IV of FIG. 3 on a larger scale.

FIG. 2 shows a side wall 8 of the housing 2. The cap 4 is positioned perpendicularly to this side wall 8. At each screw 6, the side wall 8 has a recessed zone 10. This recessed zone 10 has a two-part bottom. A first part 12 is substantially parallel to the side wall 8. This first part 12 is on the side of the corresponding screw 6 and extends over a height substantially equal to the length of the stem of the screw 6 having traversed the bore 16 supporting the self-forming screw 6. The second part 14 of the bottom of the recessed zone 10 is substantially flat. It connects the side wall 8 to the first part 12, parallel to the side wall 8 but offset relative to the latter toward the inside of the housing 2. This second part 14 of the bottom of the recessed zone 10 thus forms an inclined plane which penetrates progressively toward the inside of the housing 2 as it gets nearer to the self-forming screw 6.

The bottom of the recessed zone 10 is also connected to the side wall 8 by connecting faces 18. The latter may be substantially perpendicular to the side wall 8 or, as shown in the drawing, may themselves also be inclined, the recessed zone 10 then looking like a dish.

The remainder of the description assumes that the housing 2 is disposed so that the side wall 8 is in a substantially vertical position and that the cap 4 is disposed substantially horizontally on the top of the housing 2.

The recessed zone is overhung by a ledge 20 substantially perpendicular to the side wall 8. This ledge 20 is attached to the first part 12 of the bottom of the recessed zone 10 and forms a right angle with the latter. This ledge 20 supports the bore 16 receiving the self-forming screw 6. The ledge 20 thus forms, on the top of the housing 2, a bearing surface for the cap 4. In the embodiment shown in the drawing, it is noted that a printed circuit board .22 is sandwiched between the ledge 20 and the cap 4. This printed circuit board 22 supports electronic components not shown in the drawing.

When this housing 2 is assembled, the printed circuit board 22 is placed on the top of the housing 2 and is then covered by the cap 4. Bores facing the bores 16 of the ledges 20 of the housing 2 are provided in the printed circuit board 22 and in the cap 4. These bores made in the cap 4 and the printed circuit board 22 have a larger diameter than the diameter of the stem of the screw 6. During assembly, the screw 6 therefore traverses these bores and is stopped at the bore 16 whose initial diameter is less than the diameter of the stem of the screw 6. By screwing, the screw taps the bore 16 and forms a tapped column allowing the coupling of the screw 6. During the formation of this column, metal chips are usually formed. These chips then fall by gravity onto the second part 14 of the bottom of the recessed zone 10. This second part 14 then forms a chute discharging the chips thus formed. These chips no longer risk coming to create short circuits inside the housing 2.

In this embodiment, the stems of screws 6 are outside the housing. However, compared with a similar housing of the prior art, the external dimensions of the housing do not vary. The cost price of a housing according to the invention is substantially the same as that of a housing of the prior art. The housing according to the invention therefore makes it possible, without extra cost, to reliably prevent the problems of short circuits (or other electrical problems) due to chips falling on a printed circuit board or close to a component.

The present invention is not limited to the preferred embodiment described hereinabove as a nonlimiting example. It also relates to all the variant embodiments within the scope of those skilled in the art in the context of the following claims.

Thus, the shapes, equally of the housing, its cap and the recessed zone may be modified without departing from the context of the invention.

The assembly of the printed circuit board as a sandwich between the ledge of the housing and the cap is optional. It is possible for example to make provision to attach the cap directly to the housing. It can also be envisaged that the printed circuit board forms the cap of the housing. The fixing screws may also be used to attach elements other than a cover, cap or similar element.

The invention claimed is:

1. A metal housing (2), comprising:
   a side wall (8), having a side wall surface extending substantially along a plane and facing an outside of the housing, and having a ledge (20), the ledge having a top surface, a bottom surface, and a side surface, the side surface facing the outside of the housing,
   wherein the ledge has a bore (16), extending through the ledge (20) from top surface to the bottom surface, and configured to receive a fixing screw (6),
   wherein the side wall (8) has, at the bore (16), a recessed area (10) having a concavity oriented toward the outside of the housing and surrounded by the side wall (8),
   wherein said recessed area has a surface (14) inclined relative to the plane of the side wall (8), the inclined surface (14) configured such that metal chips resulting from the, fixing screw being screwed into the bore (16) are discharged, by gravity, toward an outside of the housing away from the plane of the side wall,
   and wherein the bottom surface of the ledge (20) forms a top portion of the recessed area (10) and is connected to the inclined surface (14).

2. The housing as claimed in claim 1, wherein the side wall (8) is substantially flat and in that the ledge (20) does not extend across the plane of the side wall.

3. The housing as claimed in claim 2, wherein the side wall (8) is substantially flat, and the bottom surface of the ledge (20) is substantially perpendicular to the plane of the side wall (8).

4. The housing as claimed in claim 1, wherein the side wall (8) is substantially flat, and the bottom surface of the ledge (20) is substantially perpendicular to the plane of the side wall.

5. The housing as claimed in claim 1, wherein the inclined surface (14) is connected to the ledge (20) by a wall portion (12), the wall portion (12) being substantially parallel to the side wall (8).

6. The housing as claimed in claim 1, further comprising:
   a cap (4) forming a cover to the housing, wherein,
   the cap (4) is configured to sandwich a printed circuit (22) between the cap (4) and the top surface of the ledge (20) such that the fixing screw screwed into the bore (16) traverses the printed circuit (22).

7. the housing as claimed in claim 1, wherein said housing is configured to contain electronic components.

8. A metal. housing (2), comprising:
   a side wall (8) extending along a plane in both a vertical direction and a horizontal direction, the side wall having a recessed portion (10) extending into the side wall (8) away from the plane,
   the recessed portion forming a substantially concave hollow in a surface portion of the side wall, an edge portion of the hollow surrounding the recessed portion, the edge portion having two opposite vertical sides, the recessed portion having a horizontal top portion (20) and a sloped portion,
   wherein the top portion (20) is substantially flat and extends into the side wall in a direction substantially perpendicular to the plane and away from the plane,
   wherein the top portion (20) has a. bore (16) configured to receive a screw (6),
   wherein the sloped portion inclines from an end of the top portion (20) recessed a distance from the plane, to a portion of the side wall (8) at the plane, the sloped portion configured to guide metal chips, propelled by gravity and resulting from the fixing screw being screwed in,away from the housing in the vertical direction.

9. The metal housing according to claim 8, wherein the bore is configured to guide the screw in a substantially vertical direction.

* * * * *

(12) EX PARTE REEXAMINATION CERTIFICATE (8419th)
United States Patent
Louchart

(10) Number: US 7,511,963 C1
(45) Certificate Issued: Jul. 19, 2011

(54) HOUSING, IN PARTICULAR HOUSING FOR ELECTRONIC COMPONENTS OR THE LIKE

(75) Inventor: Gautier Louchart, Gometz la Ville (FR)

(73) Assignee: Continental Automotive France, Toulouse Cedex (FR)

Reexamination Request:
No. 90/010,916, Mar. 16, 2010

Reexamination Certificate for:
Patent No.: 7,511,963
Issued: Mar. 31, 2009
Appl. No.: 10/564,099
Filed: Jan. 9, 2006

(22) PCT Filed: May 13, 2004

(86) PCT No.: PCT/EP2004/005135
§ 371 (c)(1),
(2), (4) Date: Jan. 9, 2006

(87) PCT Pub. No.: WO2005/009097
PCT Pub. Date: Jan. 27, 2005

(30) Foreign Application Priority Data

Mar. 1, 1992 (CA) .............................................. 2025698
Apr. 1, 1993 (FR) .............................................. 2682005

(51) Int. Cl.
*H05K 5/00* (2006.01)

(52) U.S. Cl. ......................... 361/752; 361/790; 361/800
(58) Field of Classification Search ........................ None
See application file for complete search history.

(56) References Cited

FOREIGN PATENT DOCUMENTS

JP 61-111123 U 7/1986

*Primary Examiner* — Lynne H Browne

(57) ABSTRACT

This metal housing (2) is particularly intended to contain electronic or similar components. It includes a side wall (8) furnished with a ledge (20) having a bore (16) to receive a fixing screw (6). The side wall (8) has, at the bore (16), a recessed zone (10) whose concavity is oriented toward the outside of the housing (2), the ledge (20) intended to received the screw (6) overhanging the recessed zone (10).

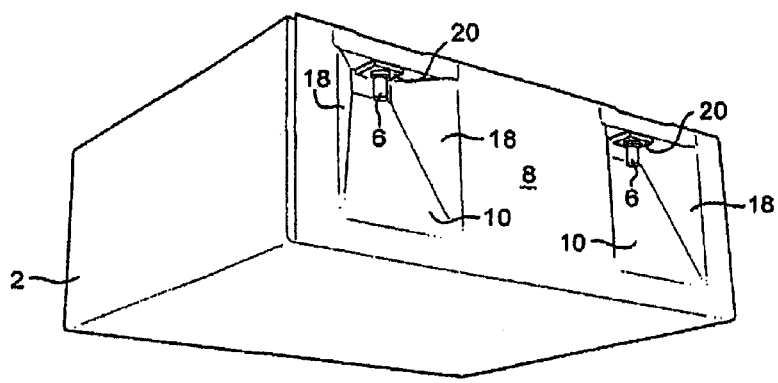
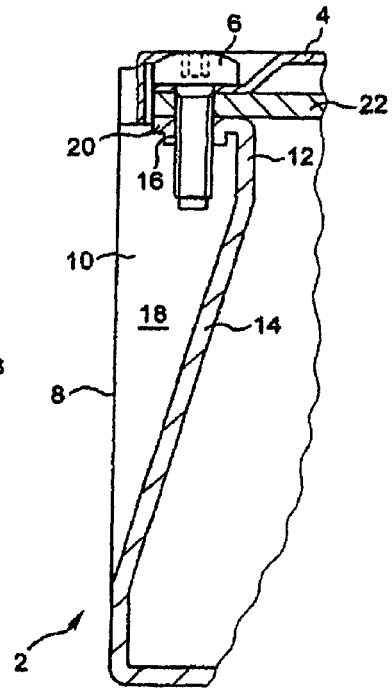

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 8 are determined to be patentable as amended.

Claims 2-7 and 9, dependent on an amended claim, are determined to be patentable.

New claims 10-19 are added and determined to be patentable.

1. A metal housing (2), comprising:
    a side wall (8), having a side wall surface extending substantially along a plane and facing an outside of the housing, and [having] *an upper portion of the side wall (8) forming a side surface of* a ledge (20), *the ledge having i) top surface, ii) a bottom surface, and iii) a side surface, the side surface facing the outside of the housing,*
    wherein the ledge has a bore (6), extending through the ledge (20) *from top surface to the bottom surface,* and configured to receive a fixing screw (6),
    wherein the side wall (8) *also* has, at the bore (16), a recessed area (10) having a concavity oriented toward the outside of the housing and surrounded by the side wall [(8)] *surface*,
    wherein said recessed area [has] *comprises* a surface (14) inclined relative to the plane of the side wall [(8)] *surface, the inclined surface (14) configured such that metal chips resulting from the fixing screw being screwed into the bore (16) are discharged, by gravity, toward an outside of the housing away from the plane of the side wall surface,*
    *and wherein the bottom surface of the ledge (20) forms a top portion of the recessed area (10) and is connected to the inclined surface (14).*

8. A metal housing (2), comprising:
    a side wall (8) extending along the plane in both a vertical direction and a horizontal direction, the side wall (8) having a recessed portion (10) extending into the side wall (8) away from the plane[, the recessed portion] *and thereby*
    forming a substantially concave hollow in a surface portion of the side wall, an edge portion of the hollow surrounding the recessed portion, the edge portion having two opposite vertical sides, the recessed portion having a horizontal top portion (20) and a sloped portion,
    wherein the top portion (20) is substantially flat and extends into the side wall in a direction substantially perpendicular to the plane and away from the plane,
    wherein the top portion (2) has a bore (16) configured to receive a screw (6), *and*
    wherein the sloped portion inclines from [an end of the top portion (20)] *a location within the hollow that is recessed a distance from the plane and beneath an end of the top portion (20)* , to a portion of the side wall (8) at the plane, the sloped portion configured to guide metal chips, propelled by gravity and resulting from the fixing screw being screwed in,away from the housing in the vertical direction.

10. *The housing as claimed in claim 1,*
    *wherein the recessed area (10) further comprises an inner-most portion maximally spaced from the plane, and a connecting face (18) extending from the side wall surface to a first side of the inner-most portion, and*
    *wherein the inclined surface (14) extends from the side wall surface to a second side of the inner-most portion, the inclined surface (14) adjoining both the connecting face (18) and the second side of the inner-most portion.*

11. *The housing as claimed in claim 1,*
    *wherein the upper portion of the side wall (8) forms a plurality of ledges (20), the recessed area (10) of each ledge (20) being spaced from each other by one or more portions of the side wall surface.*

12. *The housing as claimed in claim 8,*
    *wherein the recessed portion (10) also has a connecting face (18) extending from the side wall (8) at the plane to the location within the hollow, and*
    *wherein the sloped portion adjoins both the connecting face (18) and the location within the hollow.*

13. *The housing as claimed in claim 8,*
    *wherein the side wall (8) has a plurality of recessed portions (10), the concave hollows of the recessed portions (10) being spaced from each other.*

14. *The housing as claimed in claim 1, wherein the inclined surface is substantially vertical, and a bottom edge of the inclined surface meets with the side wall surface.*

15. *The housing as claimed in claim 8, wherein the sloped portion is substantially vertical.*

16. *A metal housing (2), comprising:*
    *a side wall (8), having a substantially planar side wall surface facing an outside of the housing,*
    *the sidewall (8) also having a recessed portion (10) extending away from a place of the side wall surface, the recessed portion (10) forming a concave hollow that comprises an interior with an upper surface and an inclined surface (14), an interface between the recessed portion (10) and the side wall surface forming a boundary that surrounds the recessed portion (10),*
    *wherein the upper surface extends between the place of the side wall and the interior of the hollow, the upper surface also forming a first surface of a ledge (20), the ledge further comprising i) a second surface opposite the first surface and outside the interior of the concave hollow and ii) a bore (16) configured to receive a fixing screw (6) from the second surface of the ledge (20) to the first surface of the ledge (20) and into the interior of the hollow, and*
    *wherein the inclined surface (14) is adjoined to the side wall surface and is inclined relative to a place of the side wall surface, the inclined surface (14) configured to cause metal chips originating from the bore (16) and influenced by gravity to be discharged toward the outside of the housing.*

17. *The housing as claimed in claim 16, wherein the concave hollow further comprises a connecting face (18) adjoining the inclined surface (14) and extending from the side wall surface to a location in the interior of the concave hollow.*

18. The housing as claimed in claim 16, wherein the side wall has a plurality of recessed portions (10), the concave hollows of the recessed portions (10) being spaced from each other by one or more portions of the side wall surface.

19. The housing as claimed in claim 16, wherein the inclined surface (14) is substantially vertical.

* * * * *